US010522378B2

(12) United States Patent
Abe et al.

(10) Patent No.: US 10,522,378 B2
(45) Date of Patent: Dec. 31, 2019

(54) STORAGE RACK

(71) Applicant: Daifuku Co., Ltd., Osaka-shi (JP)

(72) Inventors: Takeshi Abe, Hinocho (JP); Tadahiro Yoshimoto, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 16/108,804

(22) Filed: Aug. 22, 2018

(65) Prior Publication Data

US 2019/0067068 A1    Feb. 28, 2019

(30) Foreign Application Priority Data

Aug. 24, 2017    (JP) ................... 2017-161002

(51) Int. Cl.
 *H01L 21/677*    (2006.01)
 *H01L 21/673*    (2006.01)
 (Continued)

(52) U.S. Cl.
 CPC .... *H01L 21/67769* (2013.01); *A47B 47/0083* (2013.01); *A47B 47/021* (2013.01);
 (Continued)

(58) Field of Classification Search
 CPC ......... H01L 21/67769; H01L 21/67386; H01L 21/67775; H01L 21/67393; H01L 21/67781; B65G 1/14; A47B 47/0083; A47B 47/021; A47B 47/022; A47B 47/024; A47B 57/10; A47B 57/34; A47B 96/061; A47B 96/1425; A47B 47/00; A47B 47/005; A47B 47/02; A47B 47/028; A47B 57/00; A47B 57/045; A47B 57/08; A47B 57/30; A47B 57/32; A47B 96/00; A47B 96/06; A47B 96/14; A47B 96/1416
 USPC .......... 211/41.18, 191, 192, 189, 193, 90.01, 211/90.02, 26.2, 94.02, 153, 135, 103; 248/207, 218.4, 219.1, 219.3, 219.4, 250, 248/247, 235
 See application file for complete search history.

(56) References Cited

U.S. PATENT DOCUMENTS 754,817 A * 3/1904 Schriefer ............... A47B 57/16
 108/109
3,698,329 A * 10/1972 Diamond ............... A47B 96/06
 108/42

(Continued)

FOREIGN PATENT DOCUMENTS

JP       2002252277 A    9/2002

*Primary Examiner* — Jennifer E. Novosad
(74) *Attorney, Agent, or Firm* — The Webb Law Firm

(57) ABSTRACT

A storage rack includes: a plurality of supporting pillars and a platform on which an object to be stored is to be placed. The platform includes a platform body, and a pair of attachment plates each having a plate shape. A pair of surfaces that face each other of a pair of supporting pillars are respectively provided with a pair of recessed grooves into which the pair of attachment plates are inserted. Each recessed groove includes a groove-side abutting portion that extends linearly in a direction orthogonal to the left-right direction. An outer edge of the attachment plate includes a plate-side abutting portion that is parallel with the groove-side abutting portion. The platform is fixed to the pair of supporting pillars such that the plate-side abutting portion abuts against the groove-side abutting portion.

7 Claims, 8 Drawing Sheets

(51) Int. Cl.
  *A47B 47/02*   (2006.01)
  *A47B 57/34*   (2006.01)
  *A47B 96/06*   (2006.01)
  *A47B 96/14*   (2006.01)
  *A47B 57/10*   (2006.01)
  *A47B 47/00*   (2006.01)
  *B65G 1/14*    (2006.01)

(52) U.S. Cl.
  CPC .......... *A47B 47/022* (2013.01); *A47B 47/024* (2013.01); *A47B 57/10* (2013.01); *A47B 57/34* (2013.01); *A47B 96/061* (2013.01); *A47B 96/1425* (2013.01); *H01L 21/67386* (2013.01); *H01L 21/67393* (2013.01); *H01L 21/67775* (2013.01); *B65G 1/14* (2013.01); *H01L 21/67781* (2013.01)

(56) References Cited

U.S. PATENT DOCUMENTS

| | | | | |
|---|---|---|---|---|
| 3,951,080 A * | 4/1976 | Roberts | ............ | A47B 57/34 108/109 |
| 4,289,289 A * | 9/1981 | Overman | ............ | A47B 57/34 108/107 |
| 4,469,031 A * | 9/1984 | Haycock | ............ | A47B 96/14 108/108 |
| 5,054,404 A * | 10/1991 | Melgers | ............ | A47B 47/04 108/107 |
| 5,375,924 A * | 12/1994 | Pohl | ............ | A47B 57/10 108/109 |
| 5,595,127 A * | 1/1997 | Eustace | ............ | A47B 47/025 108/109 |
| 5,617,797 A * | 4/1997 | Casey | ............ | A47B 45/00 108/42 |
| 6,796,248 B1 * | 9/2004 | Dressendorfer | ....... | A47B 57/10 108/106 |
| 7,331,296 B1 * | 2/2008 | Wood | ............ | A47B 45/00 108/42 |
| 7,975,860 B2 * | 7/2011 | Dittus | ............ | H05K 7/1489 211/192 |
| 2014/0048500 A1 * | 2/2014 | Brookes | ............ | A47B 57/10 211/74 |
| 2016/0000221 A1 * | 1/2016 | Brunner | ............ | A47B 31/00 312/249.8 |
| 2017/0238710 A1 * | 8/2017 | Tsai | ............ | A47B 96/14 |
| 2018/0153312 A1 * | 6/2018 | Buck | ............ | A47F 1/126 |
| 2019/0067068 A1 * | 2/2019 | Abe | ............ | H01L 21/67769 |

* cited by examiner

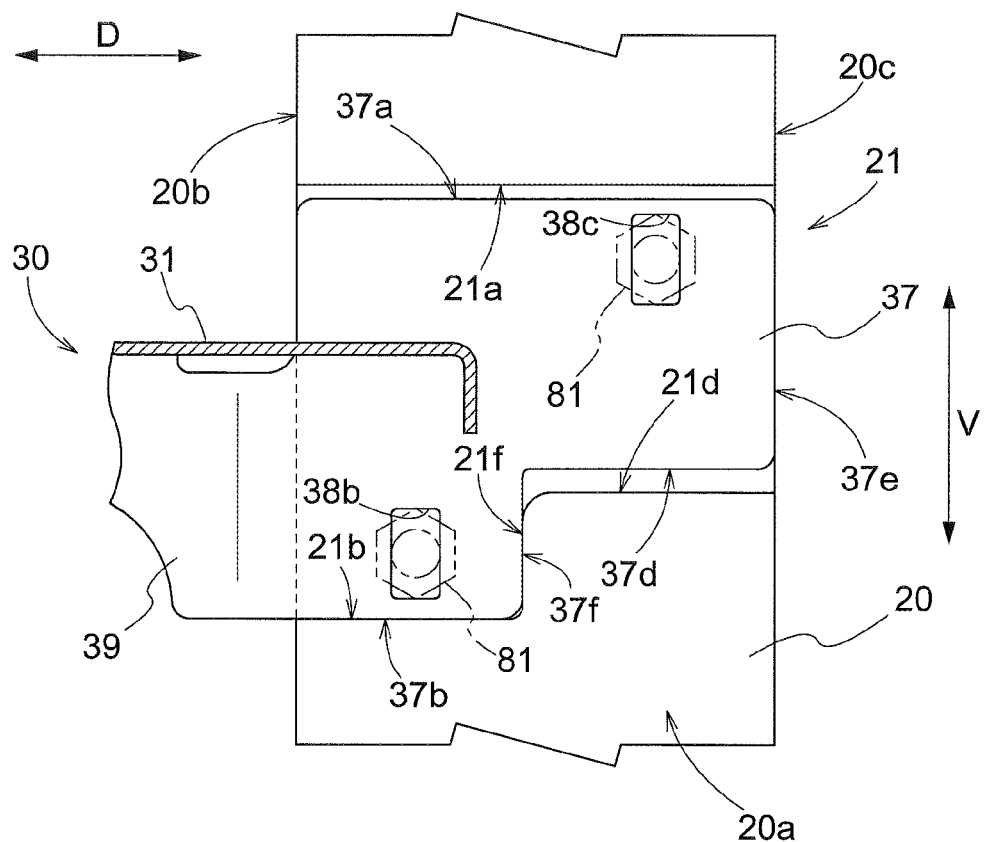

STORAGE RACK

CROSS-REFERENCE TO RELATED APPLICATION

This application claims priority to Japanese Patent Application No. 2017-161002 filed Aug. 24, 2017, the disclosure of which is hereby incorporated in its entirety by reference.

FIELD OF THE INVENTION

The present invention relates to a storage rack that has a plurality of storage sections.

BACKGROUND

In the process of manufacturing industrial products, for example, a storage facility is used to temporarily store materials, intermediate products, and so on during a waiting period or the like before a subsequent step is started. Typically, a storage facility is provided with a storage rack that has a plurality of storage sections that are regularly arranged in a top-bottom and a left-right direction, as disclosed in JP 2002-252277A (Patent Document 1).

The storage rack according to Patent Document 1 includes a plurality of supporting pillars (pillars 3), platforms (top boards 5) on which objects to be stored are to be placed, and supporting members (supporting ribs 6) that are fixed to the supporting pillars to support the platforms. In the storage rack according to the Patent Document 1, a platform is fixed to supporting members, using fastening members, such that the platform is supported from below by the supporting members, of which the respective ends are fixed to the pillars on the left and right sides of the platform.

However, such a configuration has a drawback, that is, since a pair of left and right supporting members are individually fixed to the pillars corresponding thereto, it is difficult to position the supporting members in the top-bottom direction, and misalignment directly affects the inclination of the platform. In order to avoid such a situation, it is necessary to accurately position the supporting members in the top-bottom direction. However, in such a case, it is necessary to perform careful work on all of the storage sections, and therefore installation work requires a lot of effort.

SUMMARY OF THE INVENTION

There is demand for a storage rack with which, when assembling the storage rack using a plurality of supporting pillars and a plurality of platforms, it is easy to perform installation work, while it is also possible to appropriately position the platforms.

A characteristic configuration of the storage rack in view of the above-described demand lies in that the storage rack is a storage rack including a plurality of storage sections that are regularly arranged in a top-bottom direction and a left-right direction, the storage rack further including:

a plurality of supporting pillars that stand in the top-bottom direction at left and right ends of the plurality of storage sections in the left-right direction and at positions each between the storage sections that are adjacent to one another in the left-right direction; and a platform that is fixed to a pair of supporting pillars that are adjacent to each other in the left-right direction, from among the plurality of supporting pillars, and on which an object to be stored is to be placed, wherein the platform includes a platform body, and a pair of attachment plates each having a plate shape and extending in the top-bottom direction and a front-rear direction, along two side edges, in the left-right direction, of the platform body, a pair of surfaces that face each other of the pair of supporting pillars are provided with a pair of recessed grooves into which the pair of attachment plates are inserted, such that positions, in the top-bottom direction, of the pair of recessed grooves coincide with each other, the recessed groove includes a groove-side abutting portion that extends linearly in a direction orthogonal to the left-right direction, the attachment plate has an outer edge including a plate-side abutting portion that extends linearly in parallel with the groove-side abutting portion, and the platform is fixed to the pair of supporting pillars such that the plate-side abutting portion abuts against the groove-side abutting portion.

With this characteristic configuration, when fixing an individual platform to a pair of supporting pillars that are adjacent to each other, it is possible to appropriately position the platform relative to the pair of supporting pillars by abutting the plate-side abutting portions, which are respectively formed linearly along the outer edges of the attachment plates of the platform, against the groove-side abutting portions, which are formed linearly along the recessed grooves of the supporting pillars. Also, it is possible to position a platform relative to a pair of supporting pillars by simply inserting the attachment plates into the recessed grooves and abutting the plate-side abutting portions against the groove-side abutting portions, which makes it easier to perform installation work. Therefore, it is possible to provide a storage rack with which, when assembling the storage rack using a plurality of supporting pillars and a plurality of platforms, it is easy to perform installation work, while it is also possible to appropriately position the platforms. Also, it is unnecessary to provide the supporting pillars with other parts for positioning the platforms, such as positioning pins, in order to position a platform relative to a pair of supporting pillars. Therefore, it is possible to reduce the number of parts of the storage rack, which leads to a reduction in the number of steps involved in installation work.

BRIEF DESCRIPTION OF THE DRAWINGS

FIG. 9 is a lateral cross-sectional view of a main part of a storage section in another aspect.

DETAILED DESCRIPTION

The following describes an embodiment of a storage facility. The present embodiment describes, as an example, a storage facility 1 that stores a container 7, which contains a semiconductor substrate that includes a semiconductor wafer and the like, as an object to be stored. The storage facility 1 according to the present embodiment is installed in a cleanroom, for example, and is used in the process of manufacturing semiconductor products, for example, to temporarily store materials, intermediate products, and so on during a waiting period or the like before a subsequent step is started. The storage function of the storage facility 1 is primarily realized by storage racks 2 each having a plurality of storage sections S. The following describes the storage facility 1 and the storage racks 2 according to the present embodiment in detail.

Note that, in the following description, a top-bottom direction V, a left-right direction H, and a front-rear direction D are defined relative to directions when the storage racks 2, which are fixed to the storage facility 1, are seen from the front side. That is, the top-bottom direction V coincides with the height direction of the storage racks 2, the left-right direction H coincides with the width direction of the storage racks 2, and the front-rear direction D coincides with the depth direction of the storage racks 2. Also, in the following description, an expression "to extend in a direction" does not necessarily mean to extend in or be in parallel with exactly the same direction, and is a concept that encompasses a direction that is inclined relative to the direction (e.g. at an angle no greater than 10°). Also, each of the terms related to directions, dimensions, and so on ("parallel", "equal intervals", and so on) used in the following description is a concept that encompasses a difference caused by an error (an acceptable degree of error in terms of manufacturing or installation).

Figure 1:
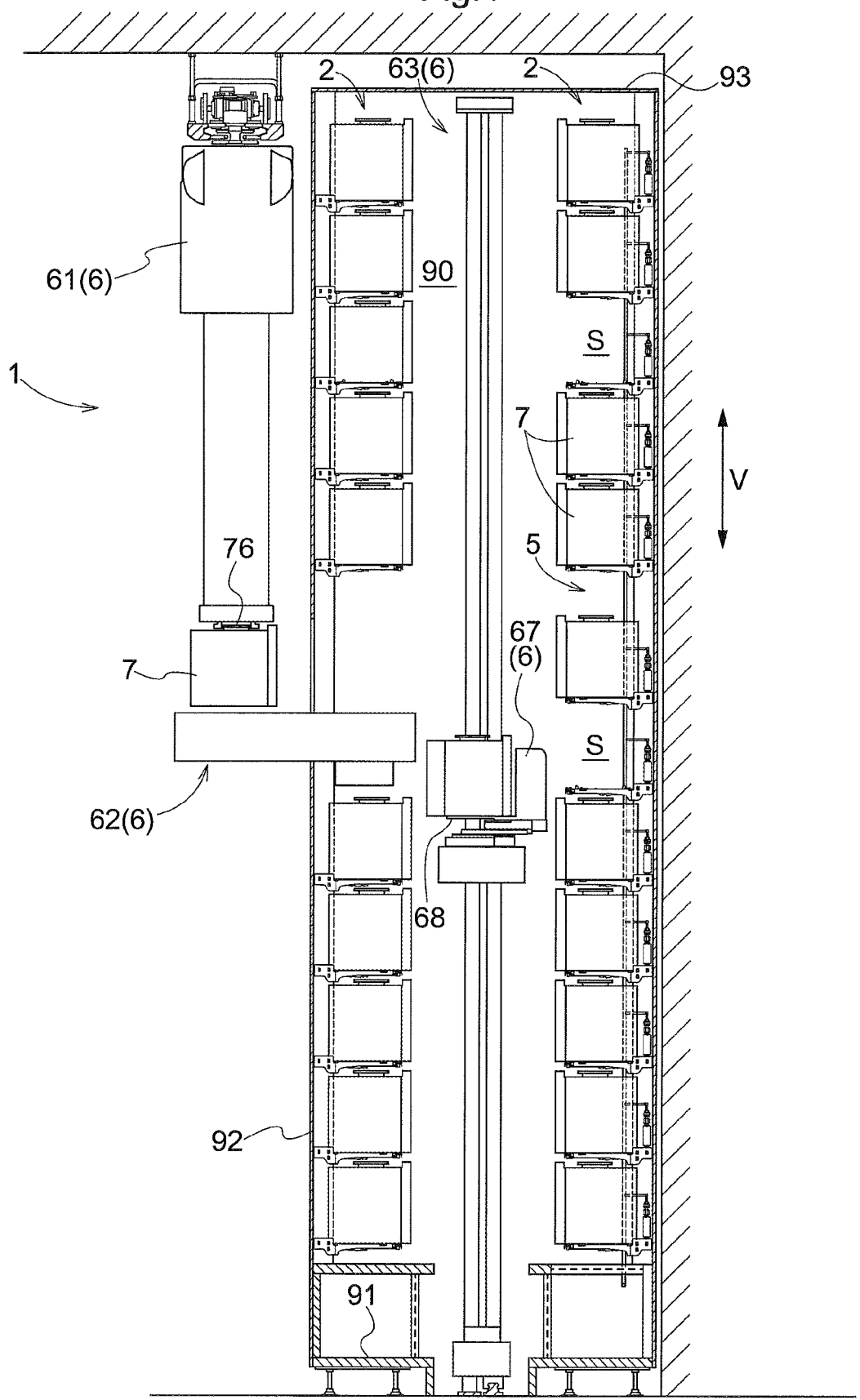
FIG. 1 is a side view of a storage facility according to an embodiment.

As shown in FIG. 1, the storage facility 1 is provided with the storage racks 2 each having a plurality of storage sections S. The storage facility 1 is also provided with a gas supplier 5 that supplies an inert gas to each of the containers 7 stored in the storage sections S. The storage racks 2 and the gas supplier 5 are located in a storage chamber 90 that is surrounded by a floor 91, a peripheral wall 92, and a ceiling 93. The storage facility 1 is also provided with a conveyor unit 6 that conveys a container 7 to/from a storage section S. The conveyor unit 6 includes a first conveyor apparatus 61, a travel apparatus 62, a second conveyor apparatus 63, and a transfer apparatus 67, as the main components. The first conveyor apparatus 61 is located outside the storage chamber 90, the travel apparatus 62 penetrates through the peripheral wall 92, and the second conveyor apparatus 63 and the transfer apparatus 67 are located inside the storage chamber 90. Operations of the gas supplier 5 and the conveyor unit 6 are controlled based on instructions from a control apparatus (not shown) included in the storage facility 1.

In the present embodiment, the storage facility 1 includes two storage racks 2 that form a pair. These two storage racks 2 are opposite each other with respect to the second conveyor apparatus 63 included in the conveyor unit 6. In the present embodiment, one of the two storage racks 2 is a "purge rack", for which the gas supplier 5 is also installed, and the other is a "non-purge rack", for which the gas supplier 5 is not installed. These racks basically have the same configuration except for points regarding whether or not the gas supplier 5 is installed, and whether or not an installation space for the travel apparatus 62 included in the conveyor unit 6 is provided.

Figure 2:
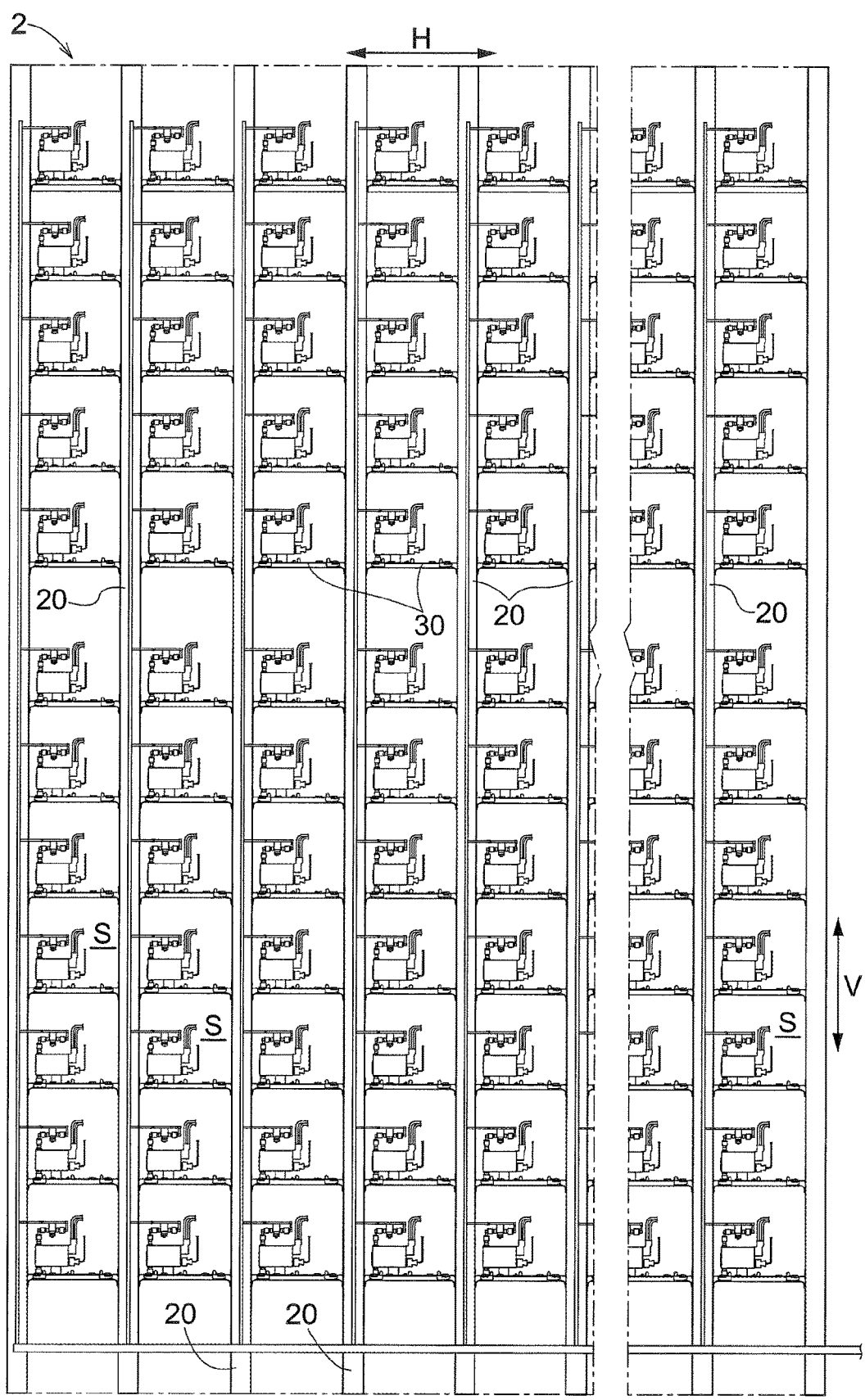
FIG. 2 is a front view of a storage rack.
Figure 3:
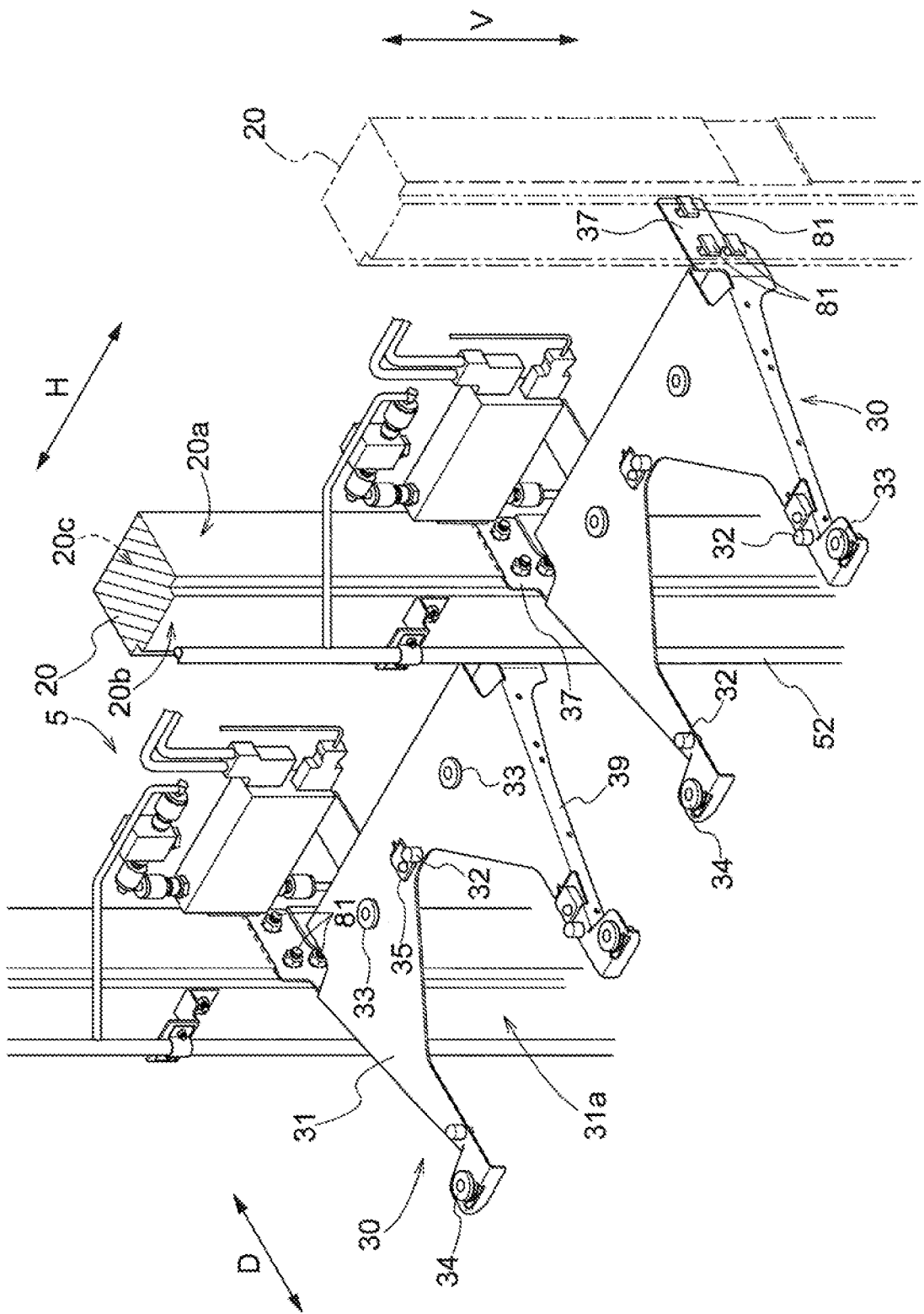
FIG. 3 is a perspective view of storage sections.
Figure 4:
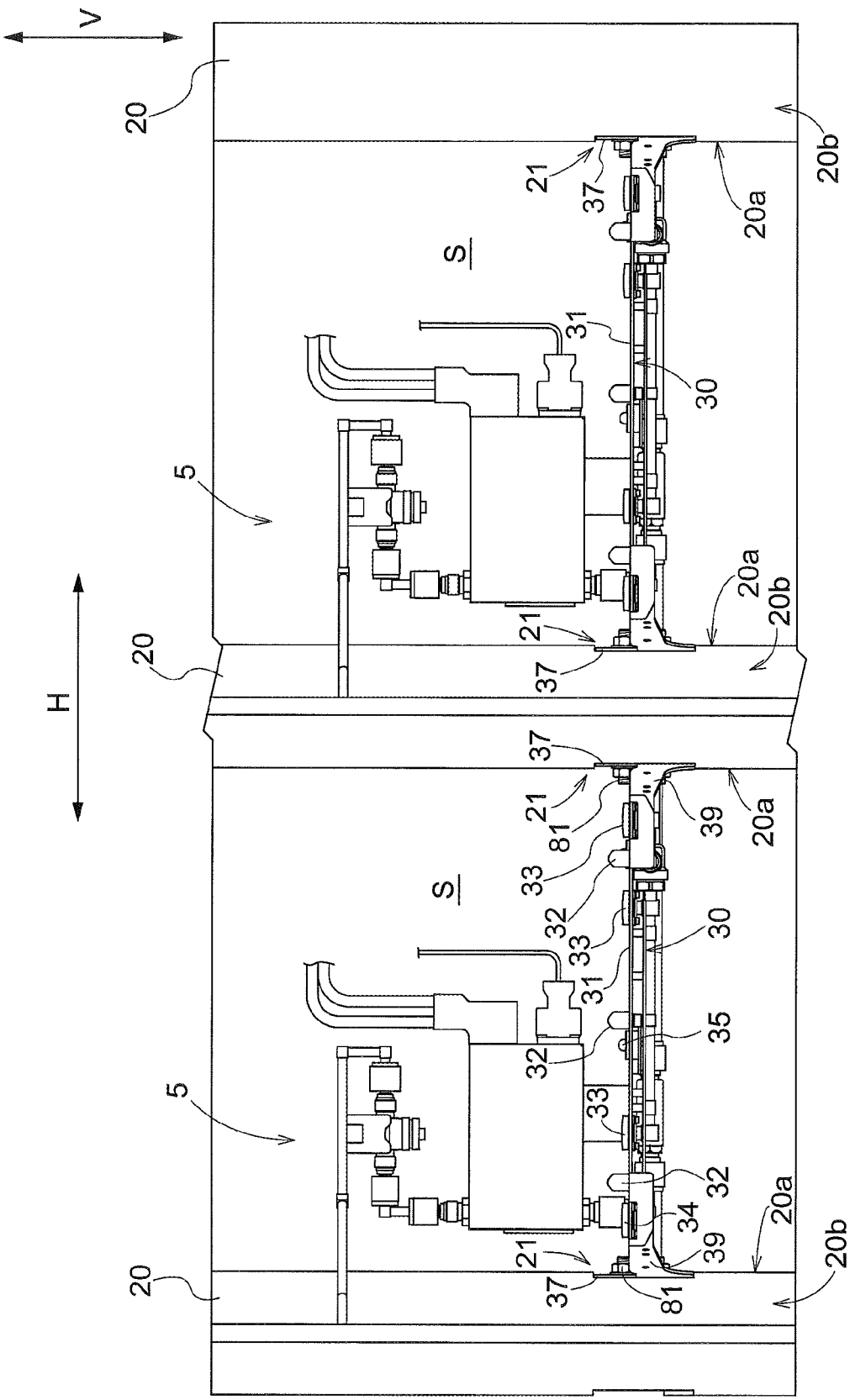
FIG. 4 is a front view of storage sections.

As shown in FIG. 2, each storage rack 2 has a plurality of storage sections S that are regularly arranged in the top-bottom direction and the left-right direction. The storage rack 2 has a plurality of (156 in this example) storage sections S that are regularly arranged in m tiers in the top-bottom direction V (m is any integer no less than 2, and m=12 in this example), and n columns in the left-right direction H (n is any integer no less than 2, and n=13 in this example). In the present embodiment, all of the storage sections S that belong to the same tier are located at the same position in the top-bottom direction V, and all of the storage sections S that belong to the same column are located at the same position in the left-right direction H. Thus, the plurality of storage sections S are regularly arranged in an orthogonal grid.

The storage rack 2 includes a plurality of supporting pillars 20 that stand in the top-bottom direction V, and platforms 30 that are supported by the supporting pillars 20 and on which a container 7 can be placed. In the present embodiment, the number of supporting pillars 20 included in the storage rack 2 is n+1, which is greater than the number of columns of storage sections S by only one. The n+1 supporting pillars 20 are arranged in a row in the left-right direction H at equal intervals. Each platform 30 is fixed to a pair of supporting pillars 20 that are adjacent to each other in the left-right direction H. In the present embodiment, m platforms 30, where m is equal to the number of tiers of storage sections S, are fixed to a pair of supporting pillars 20 that are adjacent to each other, at each of n positions, where n is equal to the number of columns of storage sections S. The storage sections S are each formed as a space that is located above a platform 30 and is defined as a space below the platform 30 that is immediately above the aforementioned platform 30. Thus, in the present embodiment, n+1 supporting pillars 20 are individually arranged at the two ends of the storage rack 2 in the left-right direction H and at the positions each between the storage sections S that are adjacent to one another in the left-right direction H.

Figure 5:
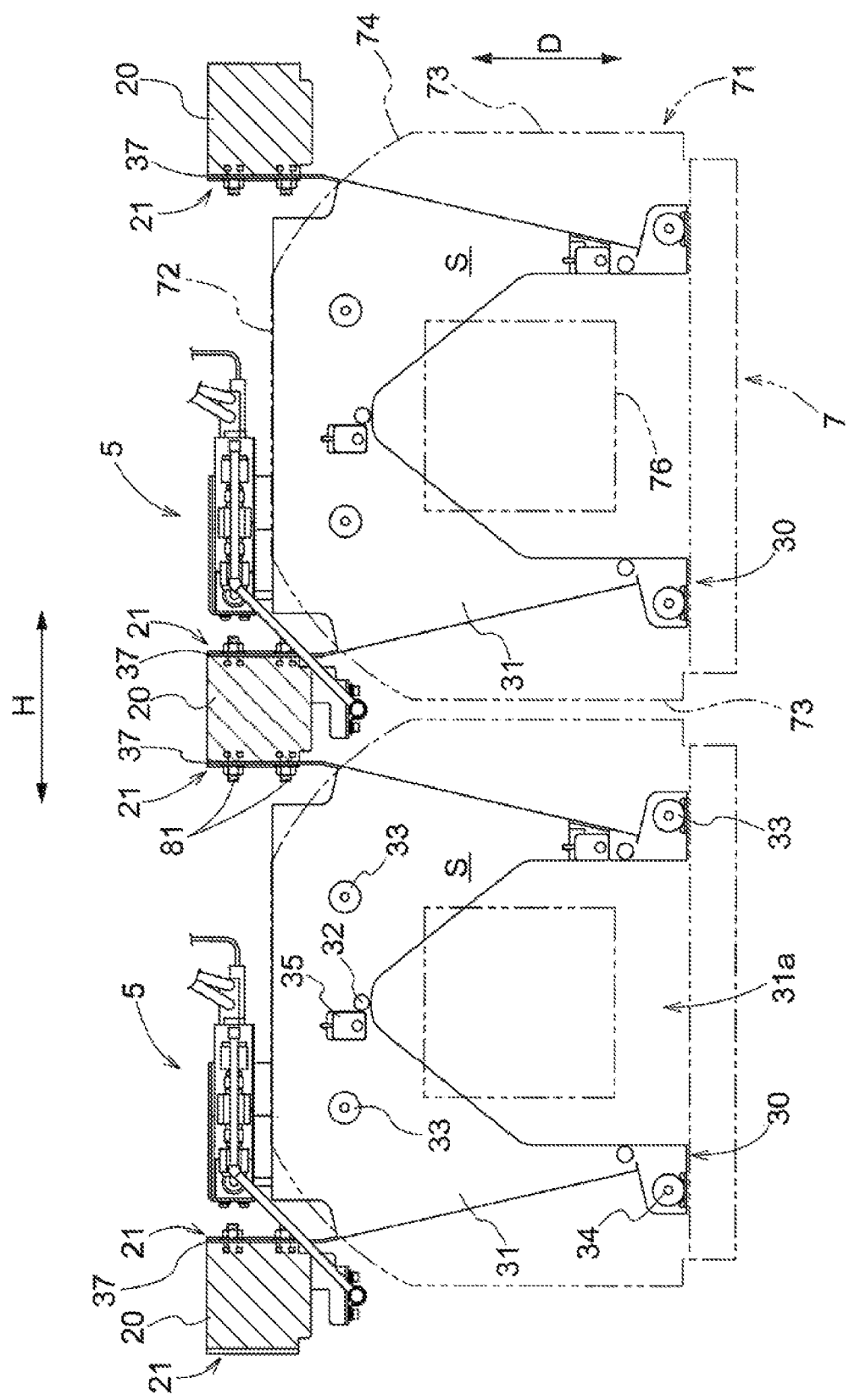
FIG. 5 is a plan view of storage sections.
Figure 6:
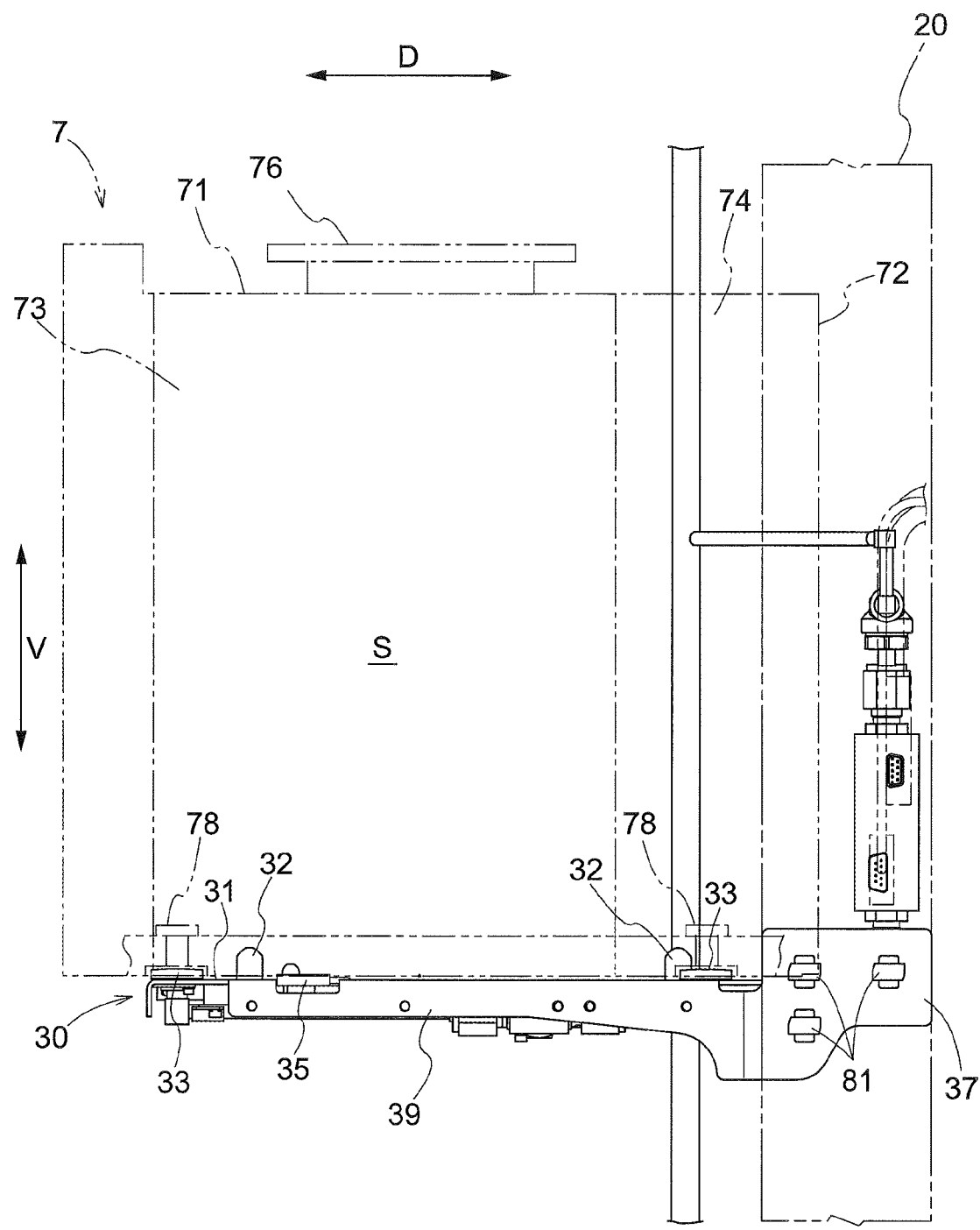
FIG. 6 is a side view of a storage section.

As an example of a container 7, a front opening-type boxed container, which is called an FOUP (Front Opening Unified Pod), may be used. Such a container 7 may be a hermetic container that is made of a synthetic resin conforming to the SEMI (Semiconductor Equipment and Materials Institute) standards. As indicated by two-dotted lines in FIGS. 5 and 6, the container 7 includes a casing 71 that has an opening, and a lid (not shown) that is configured to cover the opening and to be detachable from the casing 71. The container 7 is configured such that the internal space of the container 7 is hermetically sealed when the lid is attached to the casing 71. The container 7 also includes a flange 76 on the upper surface. The flange 76 is to be gripped by the first conveyor apparatus 61.

The container 7 included in the casing 71 has a rectangular parallelepiped shape overall. The "rectangular parallelepiped shape" means that an object substantially has a rectangular parallelepiped shape overall, and the object may include a portion that has a more or less different shape (the same applies to other expressions used together with a term "shape", regarding a configuration or the like). The container 7 includes a rear plate 72, a pair of side plates 73, and oblique plates 74 each having a flat shape or a curved shape and each located between the rear plate 72 and each of the pair of side plates 73. As described above, each container 7 according to the present embodiment has a chamfered rectangular parallelepiped shape provided with the oblique plates 74 on both the left and right on the rear side. Considering such a three-dimensional shape of each container 7 as well, a supporting pillar 20, which is installed between storage sections S that are adjacent to each other, is located in a space that is defined between oblique plates 74, which are opposite each other, of two containers 7 that are adjacent to each other in the left-right direction H when the containers 7 are placed on platforms 30 (see FIG. 5). Thus, the plurality of supporting pillars 20 included in each storage rack 2 are appropriately distributed and installed in the left-right direction H so as not to interfere with the containers 7 as objects to be stored.

In the present embodiment, as shown in FIGS. 3 to 6, each platform 30 is fixed to supporting pillars 20 in a cantilever manner, at rear-side (far-side) portions in the front-rear direction D. The front side (near side) of each platform 30 in the front-rear direction D is open, and is not supported by any member. Such a cantilever structure is advantageous in that a container 7 can be easily transferred to/from the storage section S via the front side.

Each platform 30 includes a platform body 31 that receives and supports a container 7 that is placed thereon, and a pair of attachment plates 37 that are fixed to the respective supporting pillars 20. The platform body 31 has a flat plate shape that extends in the left-right direction H and the front-rear direction D. The platform body 31 has a cutout 31a on the front side. The cutout 31a has a pentagonal shape in plan view, and thus the platform body 31 has a U shape in plan view. The cutout 31a of the platform body 31 serves as a space through which a support member 68 that is included in the transfer apparatus 67 passes in the top-bottom direction. In the present embodiment, the platform body 31 spans the entire gap between a pair of supporting pillars 20 on the left and right. That is, the area in which each platform body 31 in the present embodiment is located, in terms of the left-right direction H, is the entire gap between a pair of supporting pillars 20 on the left and right.

A plurality of protruding pins 32 (three in this example) are provided on the upper surface of the platform body 31 so as to protrude upward. The plurality of protruding pins 32 are provided along the cutout 31a. A locking recess (not shown) that is constituted by a groove, a hole, or the like is formed in the bottom surface of each container 7, and each container 7 is positioned on a platform body 31 in a state where the protruding pins 32 and the locking recess of the container 7 are locked to each other. Note that, in the present embodiment, one protruding pin 32 is located near the vertex of the pentagonal cutout 31a, and two protruding pins 32 are located near the leading ends of the U-shaped platform body 31 on the protruding side (the leading end portions of the U shape). The distance in the left-right direction H between the two protruding pins 32 located on the leading end portions of the U shape is shorter than the distance between a pair of supporting pillars 20 that are adjacent to each other in the left-right direction H.

The upper surface of the platform body 31 is provided with gas supply parts 33 for supplying an inert gas from the gas supplier 5 to the inside of a container 7, and gas discharge parts 34 that allow a gas discharged from a container 7 to pass therethrough. Branch pipes that are included in the gas supplier 5 are connected to the gas supply parts 33. Gas discharge tubes (not shown) are connected to the gas discharge parts 34. The opposite ends of the gas discharge tubes are open. The bottom surface of each container 7 is provided with gas supply ports 78 (see FIG. 6) for injecting an inert gas supplied from the gas supplier 5, and gas discharge ports (not shown) for discharging a gas in the internal space of the container 7. In a state where a container 7 is positioned on a platform body 31, the gas supply parts 33 and the gas supply ports 78 are in communication with each other, and the gas discharge parts 34 and the gas discharge ports are in communication with each other. When an inert gas is supplied from the gas supplier 5 at a predetermined pressure, the inert gas is injected from the gas supply ports 78 into the container 7 while a gas in the container 7 is discharged to the outside.

The upper surface of the platform body 31 is also provided with a plurality of (two in this example) load sensors 35. The load sensors 35 can be constituted by pressure sensors or the like, for example. The load sensors 35 detect whether or not a container 7 is placed on the platform 30 (in other words, whether or not a container 7 is stored in the storage section S).

The pair of attachment plates 37 each have a flat plate shape and extend in the top-bottom direction V and the front-rear direction D respectively along the side edges of the platform body 31 in left-right direction H. The pair of attachment plates 37 are respectively located at the ends of the platform 30 in the left-right direction H so as to face each other in the left-right direction H. The attachment plates 37 intersect the platform body 31 (so as to be orthogonal to the platform body 31 in this example). The attachment plates 37 are located such that portions thereof on the rear side of the platform body 31 are located further rearward of the platform body 31. Each attachment plate 37 is fixed to a supporting pillar 20 using a plurality of (three in this example) fastening members 81. In this example, the fastening members 81 include angular bolts and nuts that are screwed to each other.

Each platform 30 also has a pair of ribs 39 that intersect the platform body 31 (so as to be orthogonal to the platform body 31 in this example). The pair of ribs 39 are located at the ends of the platform body 31 in the left-right direction H, and each have an elongated flat plate shape that substantially extends in the top-bottom direction V and the front-rear direction D. In plan view, the ribs 39 extend linearly so as to connect the protruding pins 32 that are provided on the leading end portions of the U shape, which serve as load-receiving points of the platform body 31, to the supporting pillars 20. The ribs 39 are slightly inclined relative to the front-rear direction D (approximately 15° in this example) so as to extend inward in the left-right direction H (toward the center side of the storage sections S in the left-right direction), from the rear side on which the supporting pillars 20 are installed, to the front side on which the leading end portions of the U shape are located.

In the present embodiment, a platform body 31 and ribs 39 that constitute a platform 30 are formed integrally with each other. The same applies to attachment plates 37, that is, a platform body 31, ribs 39, and attachment plates 37 that constitute a platform 30 are formed integrally with each other. In the present embodiment, a platform body 31, ribs 39, and attachment plates 37 are formed integrally with each other by bending a flat metal plate member. Although the drawings show an example in which a plate without a hole is used as the flat metal plate member, the present invention is not limited to such a configuration, and a perforated plate such as a mesh plate or a punched plate may be used.

In the present embodiment, the platforms 30 are each provided with ribs 39 that are integrated with the platform body 31 thereof. Therefore, the strength of the platforms 30 can be improved. The ribs 39 extend linearly so as to connect the supporting pillars 20 and the leading end points of the U shape, which serve as load-receiving portions of the platform body 31. Therefore, it is possible to ensure that the platforms 30 have sufficient strength to support a container 7. In particular, it is unnecessary to provide additional reinforcement members at joints between the supporting pillars 20 and the platforms 30 to ensure that the platforms 30 have sufficient strength to support a container 7. Also, by bending a flat metal plate member, it is easy to form platforms 30 that have sufficient supporting strength despite being light in weight.

The following describes how a platform 30 is fixed to supporting pillars 20 in detail.

First, the following describes the configuration of each supporting pillar 20 in detail.

Figure 7:
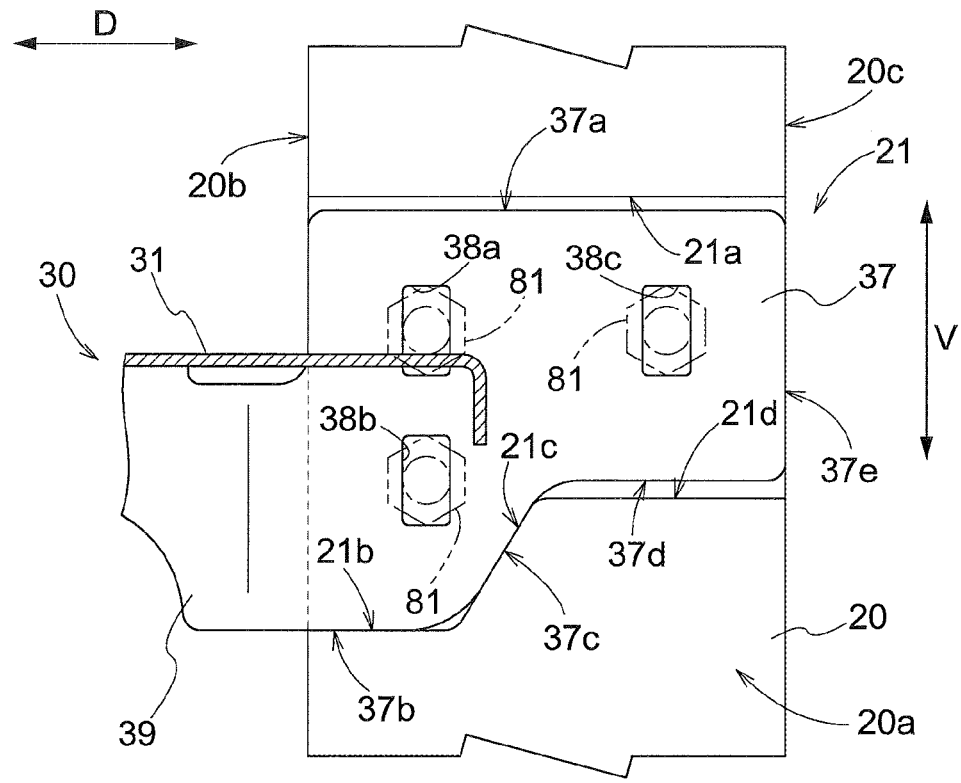
FIG. 7 is a lateral cross-sectional view of a main part of a storage section.

As shown in FIG. 7, each supporting pillar 20 is provided with a recessed groove 21 into which an attachment plate 37 of a platform 30 is inserted. The recessed groove 21 is formed through cutting, for example. Recessed grooves 21 are respectively formed in side surfaces 20a that face each other, of a pair of supporting pillars 20 that are adjacent to each other, such that the positions of the recessed grooves 21 in the top-bottom direction V coincide with each other (see FIG. 4). That is, regarding the plurality of supporting pillars 20, each pair of side surfaces 20a that face each other is provided with a pair of recessed grooves 21, into which a pair of attachment plates 37 are inserted, such that the positions of the recessed grooves 21 coincide with each other in the top-bottom direction V.

Figure 8:
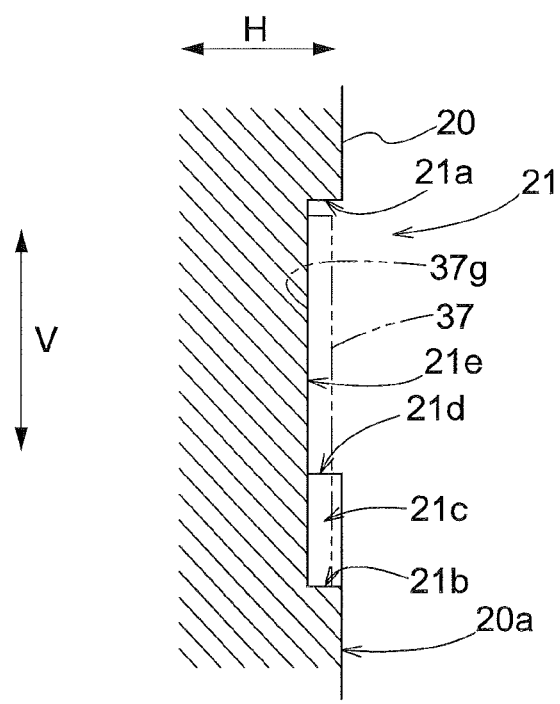
FIG. 8 is a frontal cross-sectional view of a groove in a pillar.

As shown in FIGS. 7 and 8, each recessed groove 21 has a constant depth (a length in the left-right direction H) in a side surface 20a of a supporting pillar 20 so as to penetrate through the supporting pillar 20 in the front-rear direction D. In this example, each recessed groove 21 has an upper surface 21a, a first lower surface 21b, an inclined surface 21c, a second lower surface 21d, and a side surface 21e.

The upper surface 21a is a flat surface that is located at the upper end of the recessed groove 21. The upper surface 21a is continuous with the side surface 20a of the supporting pillar 20 in the left-right direction H, and extends from a front surface 20b to a rear surface 20c of the supporting pillar 20 in the front-rear direction D, so as to have a constant length (width) in the left-right direction H. In the present embodiment, the upper surface 21a extends in the horizontal direction. The length of the upper surface 21a in the left-right direction H is almost the same as the thickness (the length in the left-right direction H) of the attachment plate 37 (in this example, the length of the upper surface 21a is slightly larger than the thickness of the attachment plate 37).

The first lower surface 21b is a flat surface that is located at the lower end of the recessed groove 21, and faces the upper surface 21a. The first lower surface 21b is continuous with the side surface 20a of the supporting pillar 20 in the left-right direction H, and extends linearly in the front-rear direction D from the front surface 20b of the supporting pillar 21 to a midpoint in the recessed groove 21 in the front-rear direction D, so as to have a constant length (width) in the left-right direction H. In the present embodiment, the first lower surface 21b extends in the horizontal direction. The length of the first lower surface 21b in the left-right direction H is almost the same as the thickness (the length in the left-right direction H) of the attachment plate 37 (in this example, the length of the first lower surface 21b is slightly larger than the thickness of the attachment plate 37). The distance from the first lower surface 21b to the upper surface 21a is the same as or slightly larger than (in this example, slightly larger than) the length of a front-side portion of the attachment plate 37 in the top-bottom direction V (the distance from an upper edge 37a to a first lower edge 37b described below). That is, the length in the top-bottom direction V of the recessed groove 21 that is open in the front surface 20b of the supporting pillar 20 is the same as or slightly larger than the length of the front-side portion of the attachment plate 37 in the top-bottom direction V.

The inclined surface 21c is a flat surface that connects the first lower surface 21b and the second lower surface 21d to each other. The inclined surface 21c is continuous with the side surface 20a of the supporting pillar 20 in the left-right direction H, and extends linearly in a direction that is inclined relative to the front-rear direction D, so as to have a constant length (width) in the left-right direction H. In the present embodiment, the angle formed between the inclined surface 21c and the first lower surface 21b is an obtuse angle (120° in this example). The inclined surface 21c is connected to the rear end of the first lower surface 21b, and extends linearly toward a middle portion of the recessed groove 21 in the front-rear direction D and the top-bottom direction V, so as to extend upward in a rearward direction (to the right in FIG. 7) from the connection portion. In the present embodiment, the lower end (front end) of the inclined surface 21c is connected to the rear end of the first lower surface 21b via a rounded connection surface. That is, the inclined surface 21c and the first lower surface 21b that extend linearly are adjacent to each other, with the connection surface therebetween.

The second lower surface 21d is located above and rearward of the first lower surface 21b, and faces the upper surface 21a. The second lower surface 21d is continuous with the side surface 20a of the supporting pillar 20 in the left-right direction H, and extends linearly from the rear surface 20c of the supporting pillar 20 to the upper end (rear end) of the inclined surface 21c in the front-rear direction D, so as to have a constant length (width) in the left-right direction H. In the present embodiment, the second lower surface 21d extends in the horizontal direction. The front end of the second lower surface 21d is connected to the upper end (rear end) of the inclined surface 21c. Also, the front end of the second lower surface 21d is connected to the upper end (rear end) of the inclined surface 21c via a rounded connection surface. The distance from the second lower surface 21d to the upper surface 21a is the same as or slightly larger than (in this example, slightly larger than) the length of a rear-side portion of the attachment plate 37 in the top-bottom direction V (the distance from the upper edge 37a to a second lower edge 37d described below). That is, the length in the top-bottom direction V of the recessed groove 21 that is open in the rear surface 20c of the supporting pillar 20 is the same as or slightly larger than the length of the rear-side portion of the attachment plate 37 in the top-bottom direction V.

The side surface 21e is the surface that is the farthest from the side surface 20a of the supporting pillar 20 from among the surfaces that constitute the recessed groove 21. The side surface 21e extends in the top-bottom direction V and in the front-rear direction D, and is continuous with the upper surface 21a, the first lower surface 21b, the inclined surface 21c, and the second lower surface 21d, on the opposite side to the side surface 20a of the supporting pillar 20 in the left-right direction H. That is, the side surface 21e is a flat surface that is parallel with the side surface 20a of the supporting pillar 20, and is located inside the supporting pillar 20 due to the length (width) of the upper surface 21a, the first lower surface 21b, the inclined surface 21c, and the second lower surface 21d in the left-right direction H.

As described above, the lower surface of the recessed groove 21 has a stepped shape due to the first lower surface 21b, the inclined surface 21c, and the second lower surface 21d.

Next, the following describes the configuration of each attachment plate 37 of each platform 30.

As shown in FIG. 7, the attachment plate 37 of the platform 30 extends in the top-bottom direction V and the front-rear direction D such that a portion of the attachment plate 37 is located further rearward of the platform body 31 on the rear side of the platform body 31. The attachment plate 37 has a shape that extends along the recessed groove 21 so that the attachment plate 37 can be inserted into the recessed groove 21. The attachment plate 37 includes an upper edge 37a, a first lower edge 37b, an inclined edge 37c, a second lower edge 37d, and a rear edge 37e, which are included in the outer edge of the attachment plate 37. The attachment plate 37 has a flat plate shape, and therefore the upper edge 37a, the first lower edge 37b, the inclined edge 37c, the second lower edge 37d, and the rear edge 37e each have a constant width in the left-right direction H.

The upper edge 37a is an outer edge that is located at the upper end of the attachment plate 37. The upper edge 37a is located at a higher level than the platform body 31. In other words, the attachment plate 37 includes an upper extension portion that extends at a higher level than the platform body 31, and the outer edge that is located at the upper end of the upper extension portion is the upper edge 37a. The upper edge 37a extends in the front-rear direction D along the upper surface 21a of the recessed groove 21. In the present embodiment, the upper edge 37a extends in the horizontal direction. The length of the upper edge 37a of the attachment plate 37 in the front-rear direction D is approximately the same (exactly the same in this example) as the length of the upper surface 21a of the recessed groove 21 in the front-rear direction D.

The first lower edge 37b is an outer edge that is located at the lower end of the attachment plate 37. The first lower edge 37b is opposite the upper edge 37a of the attachment plate 37 in the top-bottom direction V. The first lower edge 37b extends linearly in the front-rear direction D from the front end of the attachment plate 37 to a midpoint of the attachment plate 37 in the front-rear direction D. In the present embodiment, the first lower edge 37b extends in the horizontal direction. The length of the first lower edge 37b in the front-rear direction D is approximately the same as the length of the first lower surface 21b of the recessed groove 21 in the front-rear direction D. In the present embodiment, as described above, the attachment plate 37 and the rib 39 are formed integrally with each other. Therefore, the lower edge of the rib 39 and the first lower edge 37b of the attachment plate 37 are continuous and flush with each other at the connection portion therebetween.

The inclined edge 37c is an outer edge that connects the first lower edge 37b and the second lower edge 37d to each other, and extends linearly in a direction that is parallel with the inclined surface 21c of the recessed groove 21. In the present embodiment, the angle formed between the inclined edge 37c and the first lower edge 37b is an obtuse angle (120° in this example). The inclined edge 37c is connected to the rear end of the first lower edge 37b, and extends linearly toward a middle portion of the attachment plate 37 in the front-rear direction D and the top-bottom direction V, so as to extend upward in a rearward direction (to the right in FIG. 7) from the connection portion. In the present embodiment, the lower end (front end) of the inclined edge 37c is connected to the rear end of the first lower edge 37b via a rounded connection portion. That is, the inclined edge 37c and the first lower edge 37b that extend linearly are arranged such that the lower end (front end) of the inclined edge 37c and the rear end of the first lower edge 37b are adjacent to each other with the connection portion therebetween. The length of the inclined edge 37c in the direction in which the inclined edge 37c extends is approximately the same as the length of the inclined surface 21c of the recessed groove 21 in the direction in which the inclined surface 21c extends.

The second lower edge 37d is an outer edge that is located at a higher level than, and rearward of, the first lower edge 37b. The second lower edge 37d is opposite the upper edge 37a of the attachment plate 37 in the top-bottom direction V. The second lower edge 37d is connected to the upper end (rear end) of the inclined edge 37c, and extends linearly in the front-rear direction D from the connection portion to the rear edge 37e located at the rear end of the attachment plate 37. In the present embodiment, the second lower edge 37d extends in the horizontal direction. Also, the front end of the second lower edge 37d is connected to the upper end (rear end) of the inclined edge 37c via a rounded connection portion. In the present embodiment, the second lower edge 37d is located at a position where, when the attachment plate 37 is installed by being inserted into the recessed groove 21, the second lower edge 37d is away from the second lower surface 21d of the recessed groove 21 in an upward direction.

The rear edge 37e is an outer edge that is located at the rear end of the attachment plate 37. The rear edge 37e extends linearly in the top-bottom direction V from the rear end of the upper edge 37a to the rear end of the second lower edge 37d. In the present embodiment, the rear edge 37e is located at a position that coincides with the position of the rear surface 20c of the supporting pillar 20 in the front-rear direction D when the attachment plate 37 is installed by being inserted into the recessed groove 21.

As described above, the outer edge of the attachment plate 37 has a shape that extends along the recessed groove 21, and in particular, the lower edge of the attachment plate 37 has a stepped shape that extends along the lower surface of the recessed groove 21 due to the presence of the first lower edge 37b, the inclined edge 37c, and the second lower edge 37d.

A side surface 37g, which is an outer surface of the attachment plate 37 in the left-right direction H (a surface that faces the side surface 21e of the recessed groove 21 when the attachment plate 37 is inserted into the recessed groove 21), has a flat shape that extends along the side surface 21e of the recessed groove 21.

The attachment plate 37 is provided with insertion holes 38a, 38b, and 38c that penetrate through the attachment plate 37 in the thickness direction (the left-right direction H). The insertion holes 38a, 38b, and 38c are holes into which bolts are inserted. The bolts respectively constitute the fastening members 81 for fixing the platform 30 to the supporting pillar 20. The insertion holes 38a, 38b, and 38c function as fastening portions that are fastened using the fastening members 81. In this example, the insertion holes 38a, 38b, and 38c each have a vertically elongated rectangular shape in side view. Note that the positions of the insertion holes 38a, 38b, and 38c described below are examples, and the holes may be located at other positions.

The first insertion hole 38a is formed in the above-described upper extension portion that extends at a higher level than the platform body 31, at a position that is higher than a middle portion between the upper edge 37a and the first lower edge 37b of the attachment plate 37, and that is forward of the inclined edge 37c of the attachment plate 37.

The second insertion hole 38b is formed at a position that is lower than the middle portion between the upper edge 37a and the first lower edge 37b of the attachment plate 37, and that coincides with the position of the insertion hole 38a in the front-rear direction D.

The third insertion hole 38c is formed in the above-described upper extension portion that extends at a higher level than the platform body 31, at a position that is rearward of the inclined edge 37c and that coincides with the position of the insertion hole 38a in the top-bottom direction V.

The attachment plate 37 with the above-described configuration is inserted into the recessed groove 21 from the front side such that the first lower edge 37b abuts against the first lower surface 21b of the recessed groove 21 and the inclined edge 37c abuts against the inclined surface 21c of the recessed groove 21. The first lower edge 37b and the inclined edge 37c of each attachment plate 37 of the platform 30 respectively abut against the first lower surface 21b and the inclined surface 21c of the recessed groove 21 corresponding to the attachment plate 37. Therefore, it is possible to position the platform 30 in the top-bottom direction V and the front-rear direction D with high accuracy. Also, the side surface 37g of each attachment plate 37 of the platform 30 abuts against the side surface 21e of the recessed groove 21 corresponding to the attachment plate 37. Therefore, it is possible to position the platform 30 in the left-right direction H. Thus, it is possible to perform such positioning of the platform 30 by simply inserting the attachment plates 37 of the platform 30 into the recessed grooves 21 of the supporting pillars 20 and abutting the attachment plate 37 against the above-described abutting surfaces, which can make it easier to perform installation work. In particular, in the present embodiment, the attachment plate 37 and the recessed groove 21 abut against each other at two abutting surfaces that extend in two different directions. Therefore, it is possible to position the platforms 30 with higher accuracy. Note that, in the present embodiment, the first lower surface 21b of the recessed groove 21 functions as a "first groove-side abutting portion", and the inclined surface 21c of the recessed groove 21 functions as a "second groove-side abutting portion". Also, the first lower edge 37b of the attachment plate 37 functions as a "first plate-side abutting portion", and the inclined edge 37c of the attachment plate 37 functions as a "second plate-side abutting portion".

Furthermore, the first lower edges 37b of attachment plates 37 are located at the lower ends of the attachment plates 37. Therefore, when inserting the attachment plates 37 into recessed grooves 21 and fixing the platform 30 to the supporting pillars 20, it is possible to place the first lower edges 37b of the attachment plate 37 onto the first lower surfaces 21b of the recessed grooves 21. Therefore, it is possible to make it even easier to perform installation work.

Furthermore, the first lower edge 37b of the attachment plate 37 and the first lower surface 21b of the recessed groove 21 extend in the horizontal direction. Therefore, it is possible to place the first lower edge 37b of the attachment plate 37 onto the first lower surface 21b of the recessed groove 21 in a stable state. Therefore, it is easier to appropriately position the platform 30 relative to the supporting pillars 20 in the top-bottom direction V, and it is possible to make it even easier to perform installation work.

Also, the recessed groove 21 that has the first lower surface 21b and the inclined surface 21c, against which the first lower edge 37b and the inclined edge 37c of an attachment plate 37 respectively abut, is formed in the side surface 20a of each supporting pillar 20. Therefore, it is unnecessary to provide the supporting pillars 20 with parts for positioning the platforms 30, such as positioning pins. Therefore, it is possible to reduce the number of parts of the storage racks, which leads to a reduction in the number of steps involved in installation work.

After an attachment plate 37 is inserted into a recessed groove 21, bolts that are included in the fastening members 81 are inserted into the insertion holes 38a, 38b, and 38c from the head side, and the heads of the bolts are fixed to attachment holes (not shown) that are formed in the side surface 21e of the recessed groove 21, and nuts that are included in the fastening members 81 are attached to the shafts of the bolts. Thus, the attachment plate 37 is fixed to the supporting pillar 20, in a state of being inserted into the recessed groove 21.

When an attachment plate 37 is fixed to a supporting pillar 20 using fastening members 81, the first lower edge 37b of the attachment plate 37 abuts against the first lower surface 21b of the recessed groove 21, and the inclined edge 37c of the attachment plate 37 abuts against the inclined surface 21c of the recessed groove 21. Therefore, rotation of the platform 30 that may occur when the attachment plate 37 is fixed to the supporting pillar 20 using the fastening members 81 can be restricted due to the first lower edge 37b of the attachment plate 37 and the first lower surface 21b of the recessed groove 21 abutting against each other and the inclined edge 37c of the attachment plate 37 and the inclined surface 21c of the recessed groove 21 abutting against each other. Therefore, it is easy to horizontally (even in side view) install individual platforms 30.

Also, as described above, the insertion holes 38a and 38c, out of the insertion holes 38a, 38b, and 38c, are formed in the upper extension portion that extends at a higher level than the platform body 31 of the attachment plate 37. Therefore, the position at which the platform 30 is fastened to the supporting pillar 20 is separated upward from the platform body 31 on which a container 7 is to be placed. Therefore, compared to a case in which the upper extension portion is not provided, the platform 30 can efficiently resist the moment that acts on the platform 30 when a container 7 is placed on the platform body 31.

In another embodiment, the recessed groove 21 of each supporting pillar 20 and the attachment plates 37 of each platform 30 may be configured as follows.

The following mainly describes differences from the above-described embodiment. Points that are not specifically described are the same as those in the above-described embodiment.

As shown in FIG. 9, the present embodiment is different from the above-described embodiment in that a standing surface 21f is provided in each recessed groove 21 instead of the inclined surface 21c, a standing edge 37f is provided in each attachment plate 37 instead of the inclined edge 37c, two insertion holes 38b and 38c are provided in each attachment plate 37, and the positions of the two insertion holes 38b and 38c are changed in the top-bottom direction V.

The standing surface 2 if and the standing edge 37f are respectively different from the inclined surface 21c and the inclined edge 37c in that they extend in the vertical direction. In the present embodiment, the standing surface 2 if functions as the "second groove-side abutting portion", and the standing edge 37f functions as the "second plate-side abutting portion".

With the above-described configuration, when the attachment plate 37 is inserted into the recessed groove 21, the standing edge 37f of the standing edge 37f abuts against the standing surface 21f of the recessed groove 21, and thus the attachment plate 37 is restricted from moving rearward.

Therefore, it is possible to position the platform 30 in the front-rear direction D with high accuracy, and make it easier to perform installation work. Also, the standing edge 37f and the standing surface 2 if that abut against each other function to resist against the moment that acts on the platform 30 when a container 7 is placed on the platform body 31. Therefore, it is possible to desirably fix the platform 30 to the supporting pillar 20.

In the present embodiment, the attachment plate 37 is not provided with the first insertion hole 38a of the embodiment shown in FIG. 7, and is only provided with the second insertion hole 38b and the third insertion hole 38c. In the present embodiment, the third insertion hole 38c is located at a higher level than the third insertion hole 38c of the embodiment shown in FIG. 7 such that the third insertion hole 38c is located at a higher level than the platform body 31. Therefore, the position at which the platform 30 is fastened to the supporting pillar 20 is separated further upward from the platform body 31 on which a container 7 is to be placed. Therefore, the platform 30 can further efficiently resist the moment that acts on the platform 30 when a container 7 is placed on the platform body 31.

Furthermore, in the present embodiment, the second insertion hole 38b is located at a lower level than the second insertion hole 38b of the embodiment shown in FIG. 7. Therefore, the position at which the platform 30 is fastened to the supporting pillar 20 is separated further downward from the platform body 31 on which a container 7 is to be placed. Also, in the present embodiment, the second insertion hole 38b and the third insertion hole 38c are further separated from each other in the top-bottom direction V. Therefore, the platform 30 can further efficiently resist the moment that acts on the platform 30 when a container 7 is placed on the platform body 31.

Alternative Embodiments (1) The embodiments above describe, as an example, a configuration in which two groove-side abutting portions (the first lower surface 21b and the inclined surface 21c or the standing surface 210f) and two plate-side abutting portions (the first lower edge 37b and the inclined edge 37c or the standing edge 370 are provided. However, the number of groove-side abutting portions and the number of plate-side abutting portions are not limited, and it is only necessary that at least one groove-side abutting portion and at least one plate-side abutting portion are provided.

(2) The embodiments above describe, as an example, a configuration in which the first groove-side abutting portion (the first lower surface 21b) and the first plate-side abutting portion (the first lower edge 37b) extend in the horizontal direction, and the second groove-side abutting portion (the inclined surface 21c) and the second plate-side abutting portion (the inclined edge 37c) are inclined relative to the front-rear direction D, and, as an example, a configuration in which the first groove-side abutting portion (the first lower surface 21b) and the first plate-side abutting portion (the first lower edge 37b) extend in the horizontal direction, and the second groove-side abutting portion (the standing surface 21f) and the second plate-side abutting portion (the standing edge 37f) extend in the vertical direction. However, directions in which the groove-side abutting portion and the plate-side abutting portion extend are not limited, the groove-side abutting portion and the plate-side abutting portion, and it is only necessary that the groove-side abutting portion and the plate-side abutting portion extend in a direction orthogonal to the left-right direction H.

(3) The embodiments above describe, as an example, a configuration in which the plate-side abutting portion (the first lower edge 37b) is constituted by the lower edge of the attachment plate 37. However, the plate-side abutting portion is not limited to such a configuration, and may be constituted by the upper edge of the attachment plate 37, for example.

(4) The embodiments above describe, as an example, a configuration in which the second groove-side abutting portion (the inclined surface 21c and the standing surface 21f) is located adjacent to one end of the first groove-side abutting portion (the first lower surface 21b), and the second plate-side abutting portion (the inclined edge 37c and the standing edge 37f) is located adjacent to one end of the first plate-side abutting portion (the first lower edge 37b). However, the present invention is not limited to such a configuration. For example, it is possible to employ a configuration in which, in a state where the attachment plate 37 is inserted into the recessed groove 21, the second lower edge 37d of the attachment plate 37 abuts against the second lower surface 21d of the recessed groove 21 so that the second lower edge 37d functions as the second plate-side abutting portion and the second lower surface 21d functions as the second groove-side abutting portion. Also, the first groove-side abutting portion and the second groove-side abutting portion may be continuous with each other, and the first plate-side abutting portion and the second plate-side abutting portion may be continuous with each other. That is, in the present description, an expression "adjacent" is a concept that encompasses a situation in which two portions are slightly separated from each other as well as a situation in which two portions are in contact with each other.

(5) The embodiments above describe, as an example, a configuration in which, in a state where the attachment plate 37 is inserted into the recessed groove 21, the second lower edge 37d of the attachment plate 37 is located at a position that is slightly separated from the second lower surface 21d of the recessed groove 21 and the upper edge 37a of the attachment plate 37 is located at a position that is slightly separated from the upper surface 21a of the recessed groove 21. However, the present invention is not limited to such a configuration. For example, it is possible to employ a configuration in which the second lower edge 37d is in contact with the second lower surface 21d and the upper edge 37a is in contact with the upper surface 21a.

(6) The embodiments above describe, as an example, a configuration in which, in a state in which the attachment plate 37 is inserted into the recessed groove 21, the rear end of the attachment plate 37 does not protrude from the recessed groove 21. However, the present invention is not limited to such a configuration, and at least one of the front end and the rear end of the attachment plate 37 may or may not be protrude from the recessed groove 21. If at least one of the front end and the rear end of the attachment plate 37 protrudes from the recessed groove 21, the insertion holes 38a, 38b, and 38c may be formed in a portion that is inserted into the recessed groove 21, of the attachment plate 37.

(7) The embodiments above describe, as an example, a configuration in which three insertion holes 38a, 38b, and 38c or two insertion holes 38b and 38c are formed in the attachment plate 37. However, the number of insertion holes is not limited, and it is only necessary that at least one insertion hole is provided.

(8) The embodiments above describe, as an example, a configuration in which each recessed groove 21 penetrates through a supporting pillar 20 in the front-rear direction D. However, the present invention is not limited to such a configuration. It is possible to employ a configuration in which the rear end of each recessed groove 21 is not open, i.e., a configuration in which each recessed groove 21 is not open in the rear surface 20c of a supporting pillar 20.

(9) The embodiments above describe, as an example, a configuration in which the platform body 31 and the ribs 39 that constitute a platform 30 are formed integrally with each other. However, the present invention is not limited to such a configuration. For example, ribs 39 that are members that are separate from the platform body 31 may be fixed to the platform body 31.

(10) The embodiments above describe, as an example, the storage facility 1 that stores a container 7, which contains a semiconductor substrate, as an object to be stored. However, the present invention is not limited to such a configuration. An item that is to be contained and stored in the container 7 may be, for example, a glass substrate, or a reticle substrate that is made of a glass plate or the like and on which metal thin films are stacked. Also, an item that is to be contained and stored in a container 7 is not limited to an industrial product (or a material or an intermediate product), and may be food or a medicine, for example. Furthermore, an object to be stored in the storage facility 1 provided with the storage racks 2 is not limited to an FOUP, and may be a cassette-type container 7, and is not limited to a container 7, and may be a palette or the like on which a target item is placed.

(11) Note that the configurations disclosed in the above-described embodiments (including the embodiment and the other embodiments above; the same applies to the following) may be employed in combination with any configuration disclosed in the other embodiments as long as no contradiction arises. Similarly, regarding other configurations, it should be understood that the embodiments disclosed in the present specification are examples in all aspects, and the scope of the present invention is not limited to the embodiments. A person skilled in the art would easily understand that modifications can be made as appropriate without departing from the spirit of the present invention. Therefore, as a matter of course, other embodiments modified without departing from the spirit of the present invention are encompassed in the scope of the present invention.

Summary of Embodiments Described Above

The following is an overview of a storage rack described above.

The storage rack is a storage rack including a plurality of storage sections that are regularly arranged in a top-bottom direction and a left-right direction, the storage rack further including:

a plurality of supporting pillars that stand in the top-bottom direction at left and right ends of the plurality of storage sections in the left-right direction and at positions each between the storage sections that are adjacent to one another in the left-right direction; and a platform that is fixed to a pair of supporting pillars that are adjacent to each other in the left-right direction, from among the plurality of supporting pillars, and on which an object to be stored is to be placed, wherein the platform includes a platform body, and a pair of attachment plates each having a plate shape and extending in the top-bottom direction and a front-rear direction, along two side edges, in the left-right direction, of the platform body, a pair of surfaces that face each other of the pair of supporting pillars are provided with a pair of recessed grooves into which the pair of attachment plates are inserted, such that positions, in the top-bottom direction, of the pair of recessed grooves coincide with each other, the recessed groove includes a groove-side abutting portion that extends linearly in a direction orthogonal to the left-right direction, the attachment plate has an outer edge including a plate-side abutting portion that extends linearly in parallel with the groove-side abutting portion, and the platform is fixed to the pair of supporting pillars such that the plate-side abutting portion abuts against the groove-side abutting portion.

With such a configuration, when fixing an individual platform to a pair of supporting pillars that are adjacent to each other, it is possible to appropriately position the platform relative to the pair of supporting pillars by abutting the plate-side abutting portions, which are respectively formed linearly along the outer edges of the attachment plates of the platform, against the groove-side abutting portions, which are formed linearly along the recessed grooves of the supporting pillars. Also, it is possible to position a platform relative to a pair of supporting pillars by simply inserting the attachment plates into the recessed grooves and abutting the plate-side abutting portions against the groove-side abutting portions, which makes it easier to perform installation work. Therefore, it is possible to provide a storage rack with which, when assembling the storage rack using a plurality of supporting pillars and a plurality of platforms, it is possible to appropriately position the platforms, while it is easy to perform installation work. Also, it is unnecessary to provide the supporting pillars with other parts for positioning the platforms, such as positioning pins, in order to position a platform relative to a pair of supporting pillars. Therefore, it is possible to reduce the number of parts of the storage rack, which leads to a reduction in the number of steps involved in installation work.

Here, it is preferable that the platform body has a plate shape that extends in the left-right direction and the front-rear direction, the pair of attachment plates are formed integrally with the platform body, and the plate-side abutting portion is constituted by a lower edge of the attachment plate.

With this configuration, when inserting the attachment plates into the recessed grooves to fix the platform to supporting pillars, it is possible to place the plate-side abutting portions of the attachment plates onto the groove-side abutting portions of the recessed grooves. Therefore, it is easier to appropriately position the platform relative to the supporting pillars in the top-bottom direction, and it is possible to make it even easier to perform installation work.

Also, it is preferable that the recessed groove further includes a second groove-side abutting portion in addition to a first groove-side abutting portion which is the aforementioned groove-side abutting portion, the first groove-side abutting portion and the second groove-side abutting portion extend in different directions orthogonal to the left-right direction, the outer edge further includes a second plate-side abutting portion in addition to a first plate-side abutting portion which is the aforementioned plate-side abutting portion, the first plate-side abutting portion and the second plate-side abutting portion extend in different directions orthogonal to the left-right direction, the first plate-side abutting portion is parallel with the first groove-side abutting portion, the second plate-side abutting portion is parallel with the second groove-side abutting portion, and the platform is fixed to the pair of supporting pillars such that the first plate-side abutting portion abuts against the first groove-side abutting portion and the second plate-side abutting portion abuts against the second groove-side abutting portion.

With this configuration, the attachment plate and the recessed groove abut against each other in two different directions. Therefore, it is possible to position the platform with higher accuracy.

Also, it is preferable that the first groove-side abutting portion and the first plate-side abutting portion extend in a horizontal direction, the second groove-side abutting portion is located adjacent to one end of the first groove-side abutting portion, and extends in a direction that intersects the first groove-side abutting portion, and the second plate-side abutting portion is located adjacent to one end of the first plate-side abutting portion, and extends in a direction that intersects the first plate-side abutting portion.

With this configuration, it is possible to insert the attachment plate along the first groove-side abutting portions of the recessed grooves in the horizontal direction, which makes it even easier to perform installation work. Also, by abutting the first plate-side abutting portions against the first groove-side abutting portions and abutting the second plate-side abutting portions against the second groove-side abutting portion, it is possible to appropriately position the platform in the top-bottom direction and the front-rear direction.

Also, it is preferable that each of the attachment plates has a portion inserted into corresponding one of the recessed grooves, the portion fixed to the supporting pillar, using fastening member.

With this configuration, it is unnecessary to provide a dedicated fixing member for fixing the platform to the support pillars, which simplifies the shape of the platform. Therefore, such a configuration is advantageous in terms of the strength and the manufacturing costs of the platform.

Also, it is preferable that the attachment plate includes an upper extension portion that extends at a higher level than the platform body, the upper extension portion provided with fastened portion fastened using the fastening member.

With this configuration, the positions at which the platform is fastened to the supporting pillars are separated upward from the platform body on which an object to be stored is to be placed. Therefore, compared to a case in which the upper extension portions are not provided, the platform can efficiently resist the moment that acts on the platform when an object to be stored is placed on the platform body.

Also, it is preferable that a rear portion of the platform in the front-rear direction is fixed to the pair of supporting pillars in a cantilever manner.

With this configuration, it is possible to realize a storage rack with which an object to be stored can be easily transferred to/from a storage section from the front side.

INDUSTRIAL APPLICABILITY

The technology according to the present disclosure is applicable to a storage rack that has a plurality of storage sections.

What is claimed is:
1. A storage rack comprising:
a plurality of storage sections that are regularly arranged in a top-bottom direction and a left-right direction;
a plurality of supporting pillars that stand in the top-bottom direction at left and right ends of the plurality of storage sections in the left-right direction and at positions each between the storage sections that are adjacent to one another in the left-right direction; and
a platform that is fixed to a pair of supporting pillars that are adjacent to each other in the left-right direction, from among the plurality of supporting pillars, and on which an object to be stored is adapted to be placed,
wherein:
the platform includes a platform body, and a pair of attachment plates each having a plate shape and extending in the top-bottom direction and a front-rear direction, along two side edges, in the left-right direction, of the platform body,
a pair of surfaces that face each other of the pair of supporting pillars are provided with a pair of recessed grooves into which the pair of attachment plates are inserted, such that positions, in the top-bottom direction, of the pair of recessed grooves coincide with each other,
the pair of recessed grooves includes a groove-side abutting portion that extends linearly in a direction orthogonal to the left-right direction,
the pair of attachment plates has an outer edge including a plate-side abutting portion that extends linearly in parallel with the groove-side abutting portion, and
the platform is fixed to the pair of supporting pillars such that the plate-side abutting portion abuts against the groove-side abutting portion.

2. The storage rack according to claim 1, wherein the platform body has a plate shape that extends in the left-right direction and the front-rear direction,
wherein the pair of attachment plates are formed integrally with the platform body, and
wherein the plate-side abutting portion is constituted by a lower edge of the pair of attachment plates.

3. The storage rack according to claim 1, wherein:
the pair of recessed grooves further includes a second groove-side abutting portion in addition to a first groove-side abutting portion which is the aforementioned groove-side abutting portion,
the first groove-side abutting portion and the second groove-side abutting portion extend in different directions orthogonal to the left-right direction,
the outer edge further includes a second plate-side abutting portion in addition to a first plate-side abutting portion which is the aforementioned plate-side abutting portion,
the first plate-side abutting portion and the second plate-side abutting portion extend in different directions orthogonal to the left-right direction,
the first plate-side abutting portion is parallel with the first groove-side abutting portion,
the second plate-side abutting portion is parallel with the second groove-side abutting portion, and
the platform is fixed to the pair of supporting pillars such that the first plate-side abutting portion abuts against the first groove-side abutting portion and the second plate-side abutting portion abuts against the second groove-side abutting portion.

4. The storage rack according to claim 3, wherein the first groove-side abutting portion and the first plate-side abutting portion extend in a horizontal direction, wherein the second groove-side abutting portion is located adjacent to one end of the first groove-side abutting portion, and extends in a direction that intersects the first groove-side abutting portion, and wherein the second plate-side abutting portion is located adjacent to one end of the first plate-side abutting portion, and extends in a direction that intersects the first plate-side abutting portion.

5. The storage rack according to claim 1, wherein each of the pair of attachment plates has a portion inserted into corresponding one of the recessed grooves, the portion fixed to the supporting pillar, using a fastening member.

6. The storage rack according to claim 5, wherein the pair of attachment plates includes an upper extension portion that extends at a higher level than the platform body, the upper extension portion provided with a fastened portion fastened using the fastening member.

7. The storage rack according to claim 1, wherein a rear portion of the platform in the front-rear direction is fixed to the pair of supporting pillars in a cantilever manner.

\* \* \* \* \*